United States Patent
Jang

(10) Patent No.: US 8,160,524 B2
(45) Date of Patent: Apr. 17, 2012

(54) SIGNAL RECEIVING APPARATUS AND CONTROL METHOD THEREOF

(75) Inventor: Bong-ki Jang, Suwon-si (KR)

(73) Assignee: Samsung Electronics Co., Ltd, Suwon-Si (KR)

( * ) Notice: Subject to any disclaimer, the term of this patent is extended or adjusted under 35 U.S.C. 154(b) by 871 days.

(21) Appl. No.: 12/141,406

(22) Filed: Jun. 18, 2008

(65) Prior Publication Data

US 2009/0098842 A1  Apr. 16, 2009

(30) Foreign Application Priority Data

Oct. 12, 2007  (KR) .................. 10-2007-0103108

(51) Int. Cl.
*H04B 1/18* (2006.01)

(52) U.S. Cl. ........ 455/179.1; 455/47; 455/42; 455/3.02; 348/732; 348/731; 348/724

(58) Field of Classification Search ............... 455/179.1, 455/47, 42, 3.02; 348/732, 731, 724
See application file for complete search history.

(56) References Cited

U.S. PATENT DOCUMENTS

| | | | | |
|---|---|---|---|---|
| 6,490,001 | B1 * | 12/2002 | Shintani et al. | 348/554 |
| 7,787,061 | B2 * | 8/2010 | Kurose et al. | 348/731 |
| 2003/0030755 | A1 * | 2/2003 | Ahn | 348/732 |
| 2004/0036811 | A1 * | 2/2004 | Ikeguchi | 348/732 |

* cited by examiner

*Primary Examiner* — Sanh Phu
(74) *Attorney, Agent, or Firm* — Sughrue Mion, PLLC

(57) ABSTRACT

A signal receiving apparatus includes: a receiver which receives at least two types of broadcasting signals included in a plurality of channels; and a controller which controls the receiver to search a current channel according to one type of a broadcasting signal used for a previous channel search and to search a current channel according to another type of a broadcasting signal if the channel is not searched, to thereby set an automatic channel.

12 Claims, 4 Drawing Sheets

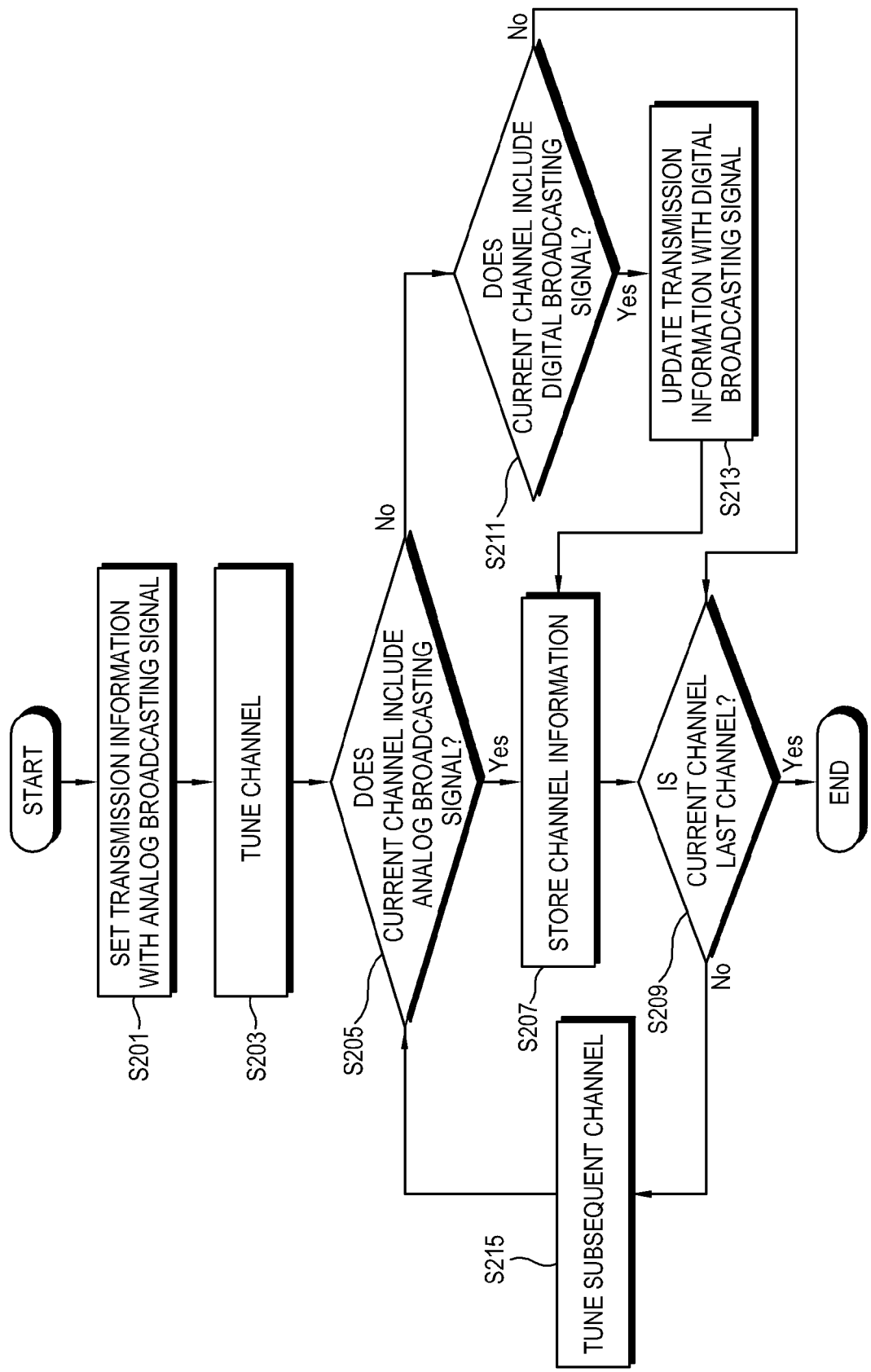

SIGNAL RECEIVING APPARATUS AND CONTROL METHOD THEREOF

CROSS-REFERENCE TO RELATED APPLICATION

This application claims priority from Korean Patent Application No. 10-2007-0103108, filed on Oct. 12, 2007, in the Korean Intellectual Property Office, the disclosure of which is incorporated herein by reference.

BACKGROUND OF THE INVENTION

1. Field of the Invention

Apparatuses and methods consistent with the present invention relate to a signal receiving apparatus and a control method thereof, and more particularly, to a signal receiving apparatus which searches a channel including a broadcasting signal, and a control method thereof.

2. Description of the Related Art

Generally, a signal receiving apparatus which receives a broadcasting signal may include an automatic channel-setting function to automatically search a channel. Here, the automatic channel-setting function tunes an overall searchable channel frequency band, and searches and sets a channel including a broadcasting signal from the overall channel frequency band. Even if a user does not know a frequency of a channel to select, the signal receiving apparatus having the automatic channel-setting function may search the channel automatically, and store all channels including a broadcasting signal as a channel map in a predetermined memory.

Meanwhile, the signal receiving apparatus may receive various types of broadcasting signals including an analog broadcasting signal, a digital broadcasting signal, a 64QAM (quadrature amplitude modulation) broadcasting signal, a 256QAM broadcasting signal and an 8VSB (vestigial sideband) broadcasting signal. The signal receiving apparatus may determine a type of the received broadcasting signal and search a channel according to the determined type of the broadcasting signal.

A conventional signal receiving apparatus has a priority to determine the type of a broadcasting signal included in a current channel to thereby search the channel automatically. That is, the conventional signal receiving apparatus searches a channel according to a first priority to determine whether the broadcasting signal of a tuned channel is included in the type of the first priority. If the broadcasting signal is not included in the type of the first priority, the signal receiving apparatus searches the channel according to a second priority.

For example, referring to FIG. 1, the signal receiving apparatus tunes a channel (S1), and determines whether the tuned channel has an analog broadcasting signal (S3). If the type of the broadcasting signal included in the channel is analog, the signal receiving apparatus stores the channel in a channel map as an analog channel (S5).

If the type of the broadcasting signal is not analog, the signal receiving apparatus digitally searches the channel to determine whether the broadcasting signal is digital (S7). If the type of the broadcasting signal is digital, the signal receiving apparatus stores the channel in the channel map as a digital channel (S9).

The signal receiving apparatus determines whether the currently-tuned channel is the last channel (S11). If the channel is not the last channel, the signal receiving apparatus tunes a subsequent channel (S13). The signal receiving apparatus repeats the foregoing processes, and searches all channels including a broadcasting signal to be stored in the channel map.

According to the conventional automatic channel-setting function, the signal receiving apparatus should search the channel at least twice to determine the type of the broadcasting signal if the tuned channel has a digital broadcasting signal. It is also time-consuming to change the type of a broadcasting signal-to-be-searched from an analog type to a digital type, thereby taking too much time to search the channel.

SUMMARY OF THE INVENTION

Accordingly, it is an aspect of the present invention to provide a signal receiving apparatus which reduces time in searching all channels including a broadcasting signal and generating a channel map, and a control method thereof Also, it is another aspect of the present invention to provide a signal receiving apparatus which reduces time to search a channel by using a property of a channel including the same type of broadcasting signals, and a control method thereof.

Additional aspects and/or advantages of the present invention will be set forth in part in the description which follows and, in part, will be obvious from the description, or may be learned by practice of the exemplary embodiments of the present invention.

The foregoing and/or other aspects of the present invention are also achieved by providing a signal receiving apparatus, comprising: a receiver which receives at least two types of broadcasting signals included in a plurality of channels; and a controller which controls the receiver to search a current channel according to one type of a broadcasting signal used for a previous channel search and to search a current channel according to another type of a broadcasting signal if the channel is not searched, to thereby set an automatic channel.

The controller may set transmission information about the type of the broadcasting signal used for the channel search if the current channel is searched, and controls the receiver to search a subsequent channel with the set transmission information.

The signal receiving apparatus may further comprise a channel storage unit which stores therein channel information about the searched channel.

The controller may control the receiver to search a current channel according to another type of a broadcasting signal based on a preset priority if the current channel is not searched with the set transmission information.

The signal receiving apparatus may further comprise a user input unit which is provided to select an automatic channel-setting function searching a channel.

The transmission information to be set may be inputted through the user input unit.

The priority to be set may be inputted through the user input unit.

The broadcasting signal may comprise an analog broadcasting signal, a digital broadcasting signal, a 64QAM broadcasting signal, a 256 QAM broadcasting signal and an 8VSB broadcasting signal.

The foregoing and/or other aspects of the present invention are also achieved by providing a control method of a signal receiving apparatus, comprising: receiving at least two types of broadcasting signals included in a plurality of channels; searching a current channel according to one type of a broadcasting signal used for a previous channel search to set a channel automatically; and searching a current channel according to another type of a broadcasting signal if the channel is not searched.

The control method may further comprise setting transmission information about a broadcasting signal used for the channel search if the current channel is searched; and searching a subsequent channel with the set transmission information.

The control method may further comprise storing channel information about the searched channel if the channel is searched.

The searching the current channel according to the another type of the broadcasting signal may comprise searching the current channel according to the another type of the broadcasting signal based on a preset priority.

The control method may further comprise selecting an automatic channel-setting function by a user to search a channel.

The transmission information to be set may be inputted by a user.

The priority to be set may be inputted by a user.

The broadcasting signal may comprise an analog broadcasting signal, a digital broadcasting signal, a 64QAM broadcasting signal, a 256QAM broadcasting signal and an 8VSB broadcasting signal.

BRIEF DESCRIPTION OF THE DRAWINGS

The above and/or other aspects of the present invention will become apparent and more readily appreciated from the following description of the exemplary embodiments, taken in conjunction with the accompanying drawings of which:

FIG. 4 is a flowchart to describe an automatic channel-setting function if signal type information of the signal receiving apparatus according to the exemplary embodiment of the present invention includes an analog broadcasting signal.

DETAILED DESCRIPTION OF EXEMPLARY EMBODIMENTS OF THE PRESENT INVENTION

Hereinafter, exemplary embodiments of the present invention will be described with reference to accompanying drawings, wherein like numerals refer to like elements and repetitive descriptions will be avoided as necessary.

Figure 1:
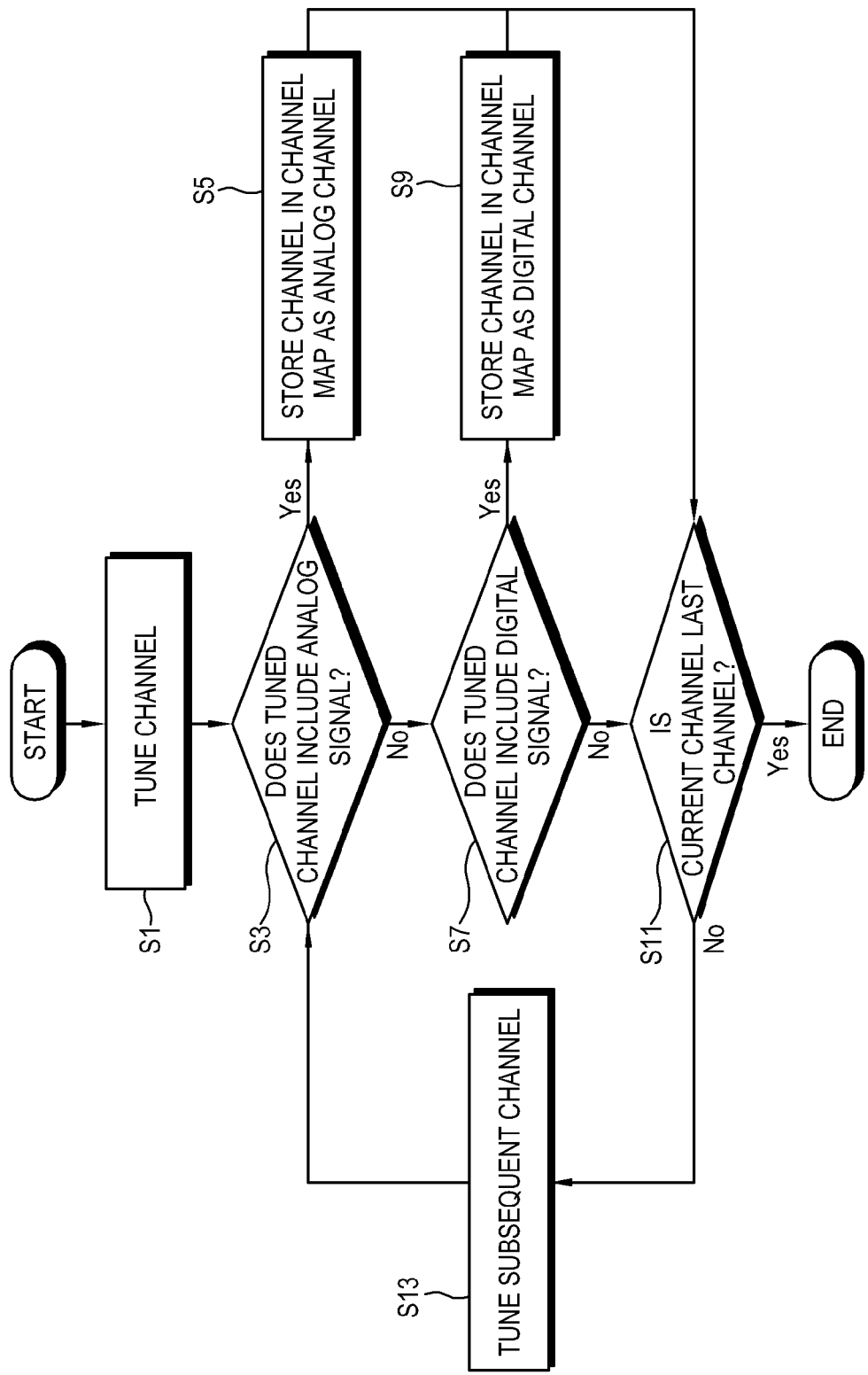
FIG. 1 is a flowchart to describe an automatic channel-setting function of a conventional signal receiving apparatus.
Figure 2:
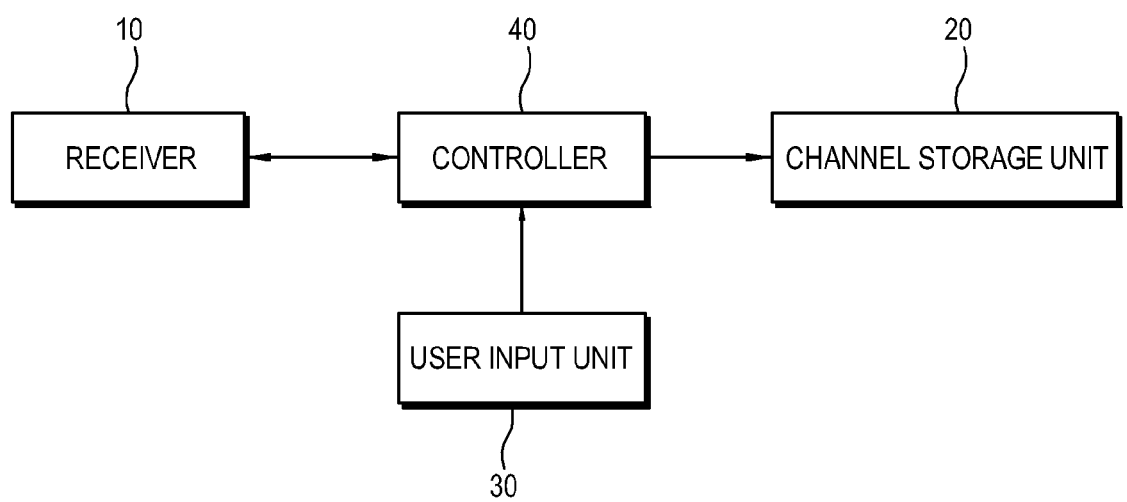
FIG. 2 is a control block diagram of a signal receiving apparatus according to an exemplary embodiment of the present invention.

Hereinafter, an exemplary embodiment of the present invention will be described in detail with reference to FIG. 2. FIG. 2 is a control block diagram of a signal receiving apparatus according to the exemplary embodiment of the present invention. The signal receiving apparatus includes a receiver 10, a channel storage unit 20, a user input unit 30 and a controller 40.

The receiver 10 of the signal receiving apparatus according to an exemplary embodiment of the present invention receives a broadcasting signal. The receiver 10 includes a tuning unit (not shown) to tune various types of broadcasting signals. The broadcasting signals may include an analog broadcasting signal, a digital broadcasting signal, a 64QAM broadcasting signal, a 256QAM broadcasting signal and an 8VSB broadcasting signal. If a channel receives the same broadcasting signals, the channel may receive them through an adjacent channel frequency band. Alternatively, the type of the broadcasting signals may vary other than those described above.

The tuning unit may include a demodulator to demodulate a tuned signal, a decoder, a multiplexer, etc. The tuning unit tunes a channel frequency corresponding to a tuning control signal of the controller 40 (to be described later) and receives a broadcasting signal. A tuner of the tuning unit may include a multi tuner to receive various types of broadcasting signals.

The channel storage unit 20 stores therein channel information such as the type of a channel searched by the tuning unit of the receiver 10, a channel frequency band, information about a broadcasting signal and a channel number. The channel storage unit 20 may include a memory such as an electrically erasable and programmable read only memory (EEPROM), a non-volatile random access memory (NVRAM), etc. The channel information stored in the channel storage unit 20 is used to tune a channel selected by a user.

The user input unit 30 is provided to select an automatic channel-setting function to search a channel including a broadcasting signal from an overall channel frequency band. The user input unit 30 may include a menu key provided in a remote controller or a casing, and a key signal generator to generate a key signal corresponding to key manipulation. The user input unit 30 may further include a number key and a direction key to select a channel, and a function key to select a function of the signal receiving apparatus.

The controller 40 performs the automatic channel-setting function and searches a current channel by using transmission information used for a previous channel search. The controller 40 may include a CPU, a microcomputer, etc.

More specifically, the controller 40 searches a plurality of channels including one type of a broadcasting signal among a plurality of types included in an overall channel frequency band if the automatic channel-setting function is selected through the user input unit 30.

Particularly, the controller 40 determines transmission information about a type of a broadcasting signal used for a previous channel search, and controls the receiver 10 to search a current channel with the determined transmission information. Here, the transmission information includes information about the type of a channel to be searched preferentially to thereby set a current channel. An initial value of the transmission information may be set during a manufacturing process of the signal receiving apparatus or by a user.

For example, the controller 40 controls the receiver 10 to search a current channel according to an analog broadcasting signal if the set transmission information includes an analog broadcasting signal, and controls the receiver 10 to search a current channel according to a digital broadcasting signal if the set transmission information includes a digital broadcasting signal.

The controller 40 stores channel information about the searched channel in the channel storage unit 20 if the current channel is searched with the transmission information. The controller 40 controls the receiver 10 to search a subsequent channel with the transmission information used for the previous channel search.

The controller 40 controls the receiver 10 to search a current channel according to another type of a broadcasting signal if the current channel is not searched with the transmission information. The controller 40 controls the receiver 10 to search the current channel according to the type of the broadcasting signal based on a preset priority. If the priority is set in order of a digital broadcasting signal and an analog broadcasting signal, the controller 40 controls to search the current channel according to a digital broadcasting signal. The controller 40 controls to search the current channel according to an analog broadcasting signal if the current channel does not include the digital broadcasting signal.

The controller 40 includes a UI generator (not shown) to generate a user interface (UI). The UI generator generates a UI so that a user inputs the priority through the user input unit 30. The generated UI may be displayed on a display unit (not shown) provided in the signal receiving apparatus or provided as an external device.

The controller 40 updates the transmission information corresponding to the searched channel if the channel is searched according to the priority. The controller 40 stores the transmission information in the channel storage unit 20, and controls the receiver 10 to tune a subsequent channel and receive a broadcasting signal.

If a broadcasting signal corresponding to a subsequent channel is received, the controller 40 controls the receiver 10 to search the subsequent channel with the updated transmission information. Generally, channels which include the same type of broadcasting signals have adjacent channel frequencies. Thus, it is very likely that the subsequent channel includes the type of a broadcasting signal corresponding to the updated transmission information.

For example, it is assumed that channel 2 to channel 60 in the overall channel frequency band include analog broadcasting signals, channel 61 to channel 120 include digital broadcasting signals and channel 121 to channel 130 include no signals. It is assumed that a standby time for changing the set type into another type of a broadcasting signal is one second, and time for determining the type of the current channel is 0.5 second.

A conventional signal receiving apparatus takes 29 seconds to search channel 2 to channel 60 (58 channels*0.5 second), 88.5 seconds to search channel 61 to channel 120 (59 channels*1 second+59 channels*0.5 second), and 18 seconds to search channel 121 to channel 130 (9 channels*1 second+9 channels*1 second), totaling 135.5 seconds.

Meanwhile, the signal receiving apparatus according to the present invention takes 29 seconds to search channel 2 to channel 60 (58 channels*0.5 second), 1.5 seconds to search channel 61 (1 second+0.5 second), 29 seconds to search channel 62 to channel 120 (59 channels*0.5 second) and 18 seconds to search channel 121 to channel 130 (9 channels*1 second+9 channels*1 second), totaling 77.5 seconds.

Thus, the signal receiving apparatus according to an exemplary embodiment of the present invention reduces time to search a broadcasting signal included in the current channel and reduce time to perform the automatic channel-setting function.

Also, the signal receiving apparatus according to an exemplary embodiment of the present invention sets the type of the broadcasting signal very likely to be received among a plurality of broadcasting signals, as the transmission information, and searches the current channel with the set transmission information to thereby search and set the channel in shorter time.

Figure 3:
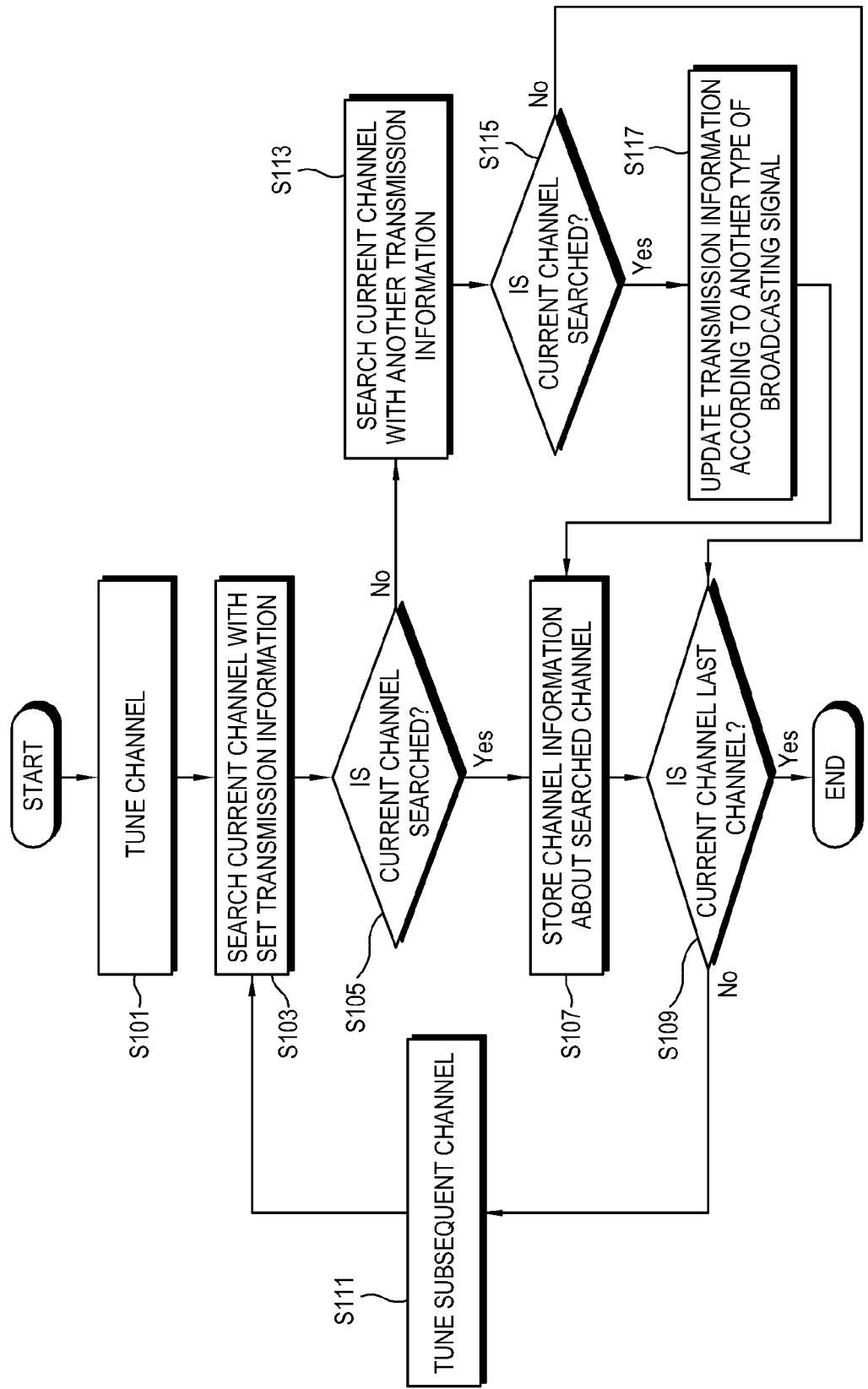
FIG. 3 is a flowchart to describe a control process of the signal receiving apparatus according to the exemplary embodiment of the present invention.

A control method of the signal receiving apparatus according to the exemplary embodiment of the present invention will be described with reference to FIG. 3.

As shown therein, if the channel is tuned (S101), the controller 40 controls the receiver 10 to search the current channel with the set transmission information (S103). As described above, the set transmission information has been used for the previous channel search.

The controller 40 determines whether the channel is searched according to a set type of a broadcasting signal (S105), and stores the channel information in the channel storage unit 20 based on the type of the searched channel if the channel is searched (S107).

The controller 40 determines whether the currently-tuned channel is the last channel in the overall channel frequency band (S109). If the currently-tuned channel is not the last channel, the controller 40 tunes a subsequent channel (S111). The controller 40 controls the receiver 10 to search a subsequent channel according to the set type of the broadcasting signal (S103).

If it is determined at operation S105 that the channel is not searched, the controller 40 controls the receiver 10 to search the current channel according to another type of a broadcasting signal (S113). If the channel is searched according to the another type of the broadcasting signal (S115), the controller 40 updates the transmission information corresponding to the type of the broadcasting signal used for the channel search (S117) and stores the channel information in the channel storage unit 20 based on the type of the searched channel if the channel is searched (S107).

In either case, the controller 40 determines whether the currently-tuned channel is the last channel in the overall channel frequency band (S109), and tunes a subsequent channel if the channel is not the last channel (S111). The controller 40 controls the receiver 10 to search a subsequent channel according to the set type of the broadcasting signal (S103).

FIG. 4 is a flowchart to describe an automatic channel-setting function if the transmission information of the signal receiving apparatus according to the exemplary embodiment of the present invention includes an analog broadcasting signal. Here, receivable broadcasting signals include analog and digital signals as an example.

As shown therein, the transmission information is set as the analog broadcasting signal (S201). If the channel is tuned (S203), the controller 40 controls the receiver 10 to search a current channel according to an analog broadcasting signal and determines whether the received signal includes the analog broadcasting signal (S205).

If it is determined at operation S205 that the current channel includes the analog broadcasting signal, the controller 40 stores the channel information in the channel storage unit 20 (S207).

The controller 40 determines whether the currently-tuned channel is the last channel in the overall channel frequency band (S209). If the currently-tuned channel is not the last channel, the controller 40 tunes a subsequent channel (S215) and repeats the foregoing processes (S205).

If it is determined at operation S205 that the current channel does not include the analog broadcasting signal, the controller 40 determines whether the current channel includes the digital broadcasting signal (S211).

If it is determined at operation S211 that the current channel includes the digital broadcasting signal, the controller 40 updates the transmission information as the digital broadcasting signal (S213). The controller 40 stores the channel information based on the digital broadcasting signal, in the channel storage unit 20 (S207).

In either case, the controller 40 determines whether the currently-tuned channel is the last channel in the overall channel frequency band (S209). If the currently-tuned channel is not the last channel, the controller 40 tunes a subsequent channel (S215), and repeats the foregoing processes (S205).

Thus, the signal receiving apparatus according to an exemplary embodiment of the present invention reduces time to search the broadcasting signal included in the current channel and reduces time to perform the automatic channel-setting function searching overall channels.

Also, the signal receiving apparatus according to an exemplary embodiment of the present invention sets the type of the broadcasting signal very likely to be received among a plurality of broadcasting signals, as the transmission information, and searches the current channel with the set transmission information to thereby search and set the channel in shorter time.

As described above, an exemplary embodiment of the present invention provides a signal receiving apparatus which reduces time to determine a type of a broadcasting signal included in a current channel and reduces time to perform an automatic channel-setting function searching overall channels, and a control method thereof Also, another exemplary embodiment of the present invention provides a signal receiving apparatus which sets a type of a broadcasting signal that is very likely to be received among a plurality of broadcasting signals, as transmission information, and searches a current channel with the set transmission information to search and set a channel in short time, and a control method thereof.

Although a few exemplary embodiments of the present invention have been shown and described, it will be appreciated by those skilled in the art that changes may be made in these exemplary embodiments without departing from the principles and spirit of the invention, the scope of which is defined in the appended claims and their equivalents.

What is claimed is:

1. A signal receiving apparatus, comprising:
   a receiver which receives at least two types of broadcasting signals included in a plurality of channels;
   a controller which controls the receiver to search a current channel according to one type of a broadcasting signal used for a previous channel search and to search the current channel according to another type of a broadcasting signal if the current channel is not found by the search according to the one type, to thereby set an automatic channel; and
   a user input unit which is provided to select an automatic channel-setting function searching a channel,
   wherein the controller sets transmission information about the type of the broadcasting signal used for the channel search when the current channel is found, and controls the receiver to search a subsequent channel according to the set transmission information.

2. The signal receiving apparatus according to claim 1, further comprising a channel storage unit which stores therein channel information about the found channel.

3. The signal receiving apparatus according to claim 1, wherein the controller controls the receiver to search a current channel according to another type of a broadcasting signal based on a preset priority if the current channel is not found with the set transmission information.

4. The signal receiving apparatus according to claim 3, wherein the transmission information to be set is inputted through the user input unit.

5. The signal receiving apparatus according to claim 3, wherein the priority to be set is inputted through the user input unit.

6. The signal receiving apparatus according to claim 1, wherein the broadcasting signal comprises an analog broadcasting signal, a digital broadcasting signal, a 64QAM (quadrature amplitude modulation) broadcasting signal, a 256 QAM broadcasting signal and an 8VSB (vestigial side-band) broadcasting signal.

7. A control method of a signal receiving apparatus, comprising:
   receiving at least two types of broadcasting signals included in a plurality of channels;
   selecting an automatic channel-setting function by a user via a user input unit to search a channel;
   searching a current channel according to one type of a broadcasting signal used for a previous channel search to set an automatic channel; and
   searching the current channel according to another type of a broadcasting signal if the current channel is not found by the searching according to the one type,
   when the current channel is found, setting transmission information about a type of the broadcasting signal of the found current channel; and
   searching a subsequent channel according to the set transmission information.

8. The control method according to claim 7, further comprising storing channel information about the searched channel if the channel is found.

9. The control method according to claim 7, wherein the searching the current channel according to the another type of the broadcasting signal comprises searching the current channel according to the another type of the broadcasting signal based on a preset priority.

10. The control method according to claim 9, wherein the transmission information to be set is inputted by a user.

11. The control method according to claim 9, wherein the priority to be set is inputted by a user.

12. The control method according to claim 7, wherein the broadcasting signal comprises an analog broadcasting signal, a digital broadcasting signal, a 64QAM (quadrature amplitude modulation) broadcasting signal, a 256 QAM broadcasting signal and an 8VSB (vestigial side-band) broadcasting signal.

* * * * *